(12) United States Patent
Shimimura et al.

(10) Patent No.: US 7,550,252 B2
(45) Date of Patent: Jun. 23, 2009

(54) INK-JET RECORDING HEAD AND METHOD FOR PRODUCING SAME

(75) Inventors: Akihiko Shimimura, Yokohama (JP);
Tadayoshi Inamoto, Hachioji (JP);
Kazunari Ishizuka, Suntoh-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/852,752

(22) Filed: Sep. 10, 2007

(65) Prior Publication Data
US 2008/0160454 A1  Jul. 3, 2008

(30) Foreign Application Priority Data
Sep. 21, 2006  (JP) .............................. 2006-255813

(51) Int. Cl.
*B41J 3/04* (2006.01)
(52) U.S. Cl. ....................................................... 430/320
(58) Field of Classification Search ....................... None
See application file for complete search history.

(56) References Cited

U.S. PATENT DOCUMENTS

| 4,657,631 | A | 4/1987 | Noguchi ..................... 156/655 |
| 6,390,606 | B1 | 5/2002 | Terui et al. ..................... 347/63 |
| 2004/0072107 | A1* | 4/2004 | Kubota et al. ............... 430/320 |
| 2006/0014107 | A1* | 1/2006 | Park et al. .................... 430/320 |

* cited by examiner

*Primary Examiner*—John A. McPherson
(74) *Attorney, Agent, or Firm*—Fitzpatrick, Cella, Harper & Scinto

(57) ABSTRACT

A method for producing an ink-jet recording head having a discharge port configured to discharge ink, a passage-forming member configured to form an ink passage communicating with the discharge port, and a substrate provided with an energy-generating element configured to generate energy utilized for discharging ink includes the steps of forming a pattern for the passage on the substrate, the pattern being composed of a positive photosensitive resin that is insensitive to light having a wavelength of 300 nm to 470 nm, forming a coating resin layer to be the passage-forming member on the substrate having the pattern, exposing the coating resin layer to only light having a wavelength of 300 nm or more to form the discharge port, and removing the pattern to form the passage.

9 Claims, 4 Drawing Sheets

INK-JET RECORDING HEAD AND METHOD FOR PRODUCING SAME

BACKGROUND OF THE INVENTION

1. Field of the Invention

The present invention relates to an ink-jet recording head configured to generate droplets of a recording liquid applicable to ink-jet recording and relates to a method for producing the head.

2. Description of the Related Art

In general, ink-jet recording heads applicable to ink-jet recording each include a minute recording-liquid-discharging nozzle (hereinafter, referred to as a "discharge port"), a liquid passage, and a liquid-discharge-energy-generating portion disposed at part of the liquid passage. Hitherto, a method described in U.S. Pat. No. 4,657,631 has been known as a method for producing such an ink-jet recording head.

The method described in U.S. Pat. No. 4,657,631 includes forming a liquid passage pattern with a soluble resin, coating the pattern with an epoxy resin or the like and effecting curing, cutting a substrate, and removing the soluble resin by dissolution. According to the method, bonding and cutting are performed while the ink passage is filled with the soluble resin. Thus, problems such as intrusion of adhesives or dust into the ink passage and chipping or cracking of the ink discharge port are prevented.

A method including forming an ink passage pattern with a positive resist, coating the passage pattern with a photocurable resin, forming a nozzle (ink nozzle) on an energy-generating element by photopatterning, and eluting the positive resist to form an ink passage has been reported as an advanced method. In this method, the ink passage and the nozzle (ink nozzle) are formed not by cutting but by photolithography; hence, processing can be performed with very high accuracy.

As described in U.S. Pat. No. 6,390,606, in some cases, to increase adhesion to a coating resin layer covering an ink passage pattern, an adhesion-improving-layer pattern composed of a thermoplastic resin is formed on a substrate including an energy-generating element.

In the case where an ink passage is formed by forming an ink passage pattern composed of a positive resist and then removing the ink passage pattern by dissolution, it goes without saying that the ink passage pattern should have shape stability as a mold in order to form the ink passage with high accuracy. However, during patterning of the coating resin layer, the resin layer partially transmits light to inevitably expose the positive resist constituting the ink passage pattern to light. This may cause reducing a chemical change of part of the positive resist, the shape stability as a mold, and thus degrading the shape accuracy of the ink passage.

In the case where the adhesion-improving-layer pattern is formed, in some cases, the molecular weight of part of the ink passage pattern is reduced by light reflected from the adhesion-improving-layer pattern. Furthermore, a crack may form during the development of the coating resin layer. In some cases, the crack causes an abnormality of the discharge port shape, thus resulting in nonuniformity of the discharge direction of the ink droplets discharged and reducing the size of the ink droplets discharged. This may result in a nonuniform image.

In recent years, trends toward improvements in the quality of images obtained by ink-jet recording have required a reduction in the volume of the ink droplets to be discharged and an increase in droplet landing accuracy. Thus, the ink passages have been required to have higher shape accuracy. Therefore, ink passage patterns have been required to have higher shape stability as molds.

SUMMARY OF THE INVENTION

The present invention has been made in consideration of the above problems. The present invention provides a method for producing an ink-jet recording head including an ink passage with high accuracy in shape, and provides an ink-jet recording head produced by the method.

An embodiment of the present invention will be described below.

A method for producing an ink-jet recording head having a discharge port configured to discharge ink, a passage-forming member configured to form an ink passage communicating with the discharge port, and a substrate provided with an energy-generating element configured to generate energy utilized for discharging ink includes the steps of:

forming a pattern for the passage on the substrate, the pattern being composed of a positive photosensitive resin that is insensitive to light having a wavelength of 300 nm or more; forming a coating resin layer on the substrate having the pattern to become the passage-forming member, the coating resin layer being composed of a negative photosensitive resin; exposing the coating resin layer only to light having a wavelength of 300 nm to 470 nm, to form the discharge port; and removing the pattern to form the passage.

According to the method for producing an ink-jet recording head, an ink-jet recording head having a passage with high accuracy in shape and having high droplet landing accuracy can be formed.

Further features of the present invention will become apparent from the following description of exemplary embodiments with reference to the attached drawings.

DESCRIPTION OF THE EMBODIMENTS

Figure 1:
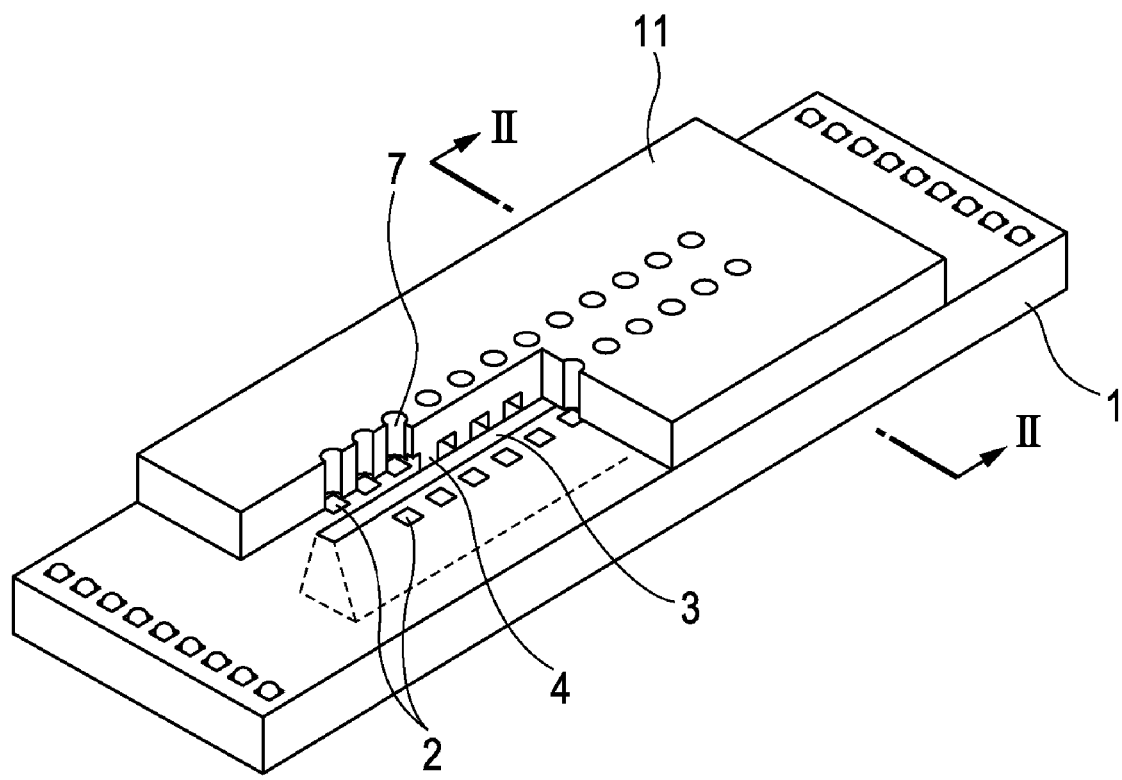
FIG. 1 is a schematic perspective view of an ink-jet recording head according to an embodiment of the present invention.

The present invention will be described in detail with reference to the drawings.

An ink-jet recording head can be mounted on apparatuses, such as printers, copiers, facsimiles including communication systems, and word processors including printers, and industrial recording equipment in which various processing apparatuses are combined. Recording can be performed on various recording media, such as paper, strings, fibers, fabrics, leather, metals, plastics, glass, lumber, and ceramics, with the ink-jet recording head. The term "recording" used in this specification means that not only images, such as characters and figures, having meanings are applied to recording media but also images, such as patterns, having no meaning are applied.

The terms "ink" or "liquid" should be widely construed and refers to a liquid which forms an image, a figure, or a pattern, which processes a recording medium, or which is used for the treatment of ink or a recording medium when the liquid is applied to a recording medium. The phrase "treatment of ink or a recording medium" refers to, for example, the improvement of fixation by the solidification or insolubilization of a colorant in ink applied to the recording medium, the improvement of recording quality and color forming properties, and/or the improvement of image permanence.

In the following description, the same or equivalent elements are designated using the same reference numerals in the drawings, and redundant description is not provided.

FIG. 1 is a schematic view of an ink-jet recording head according to an embodiment of the present invention.

The ink-jet recording head according to this embodiment includes a silicon substrate 1 having discharge-energy-generating elements (ink-discharge-energy-generating elements) 2 which generate energy utilized for discharging ink and which are arranged in two lines at a predetermined pitch. The substrate 1 includes supply ports 3 formed by anisotropically etching silicon, each supply port 3 being arranged between two lines of the energy-generating elements 2. For the sake of convenience, only a single supply port 3 is shown. Discharge ports 7 located opposite the energy-generating elements 2, and individual passages communicating with a supply port 3 and the discharge ports 7 are formed on the substrate 1 by a passage-forming member (passage wall) 11. The positions of the discharge ports 7 are not limited to positions opposite the energy-generating elements 2.

The ink-jet recording head is arranged in such a manner that a surface on which the discharge ports 7 are formed faces a recoding surface of a recording medium. In the case of the ink-jet recording head, recording is performed by applying energy generated by the energy-generating elements 2 to ink that has flowed into the passages from a supply port 3, discharging ink droplets from the discharge ports 7, and attaching the ink droplets to the recording medium. Non-limiting examples of the energy-generating elements include electrothermal transducers, such as heaters, for thermal energy, and piezoelectric elements for mechanical energy.

FIGS. 2A to 2G are schematic cross-sectional views illustrating a method for producing an ink-jet recording head according to an embodiment of the present invention. Each of FIGS. 2A to 2G is a cross-sectional view taken along the line II-II in FIG. 1.

Figure 2A:
FIGS. 2A to 2G are schematic cross-sectional views illustrating a method for producing an ink-jet recording head according to an embodiment of the present invention.

The substrate 1 (base) composed of glass, a ceramic material, plastic, or a metal is prepared as shown in FIG. 2A.

The shape and material of the substrate 1 are not particularly limited and any shape and material of the substrate 1 may be used as long as it functions as part of the passage-forming member and as a support for an ink-passage pattern 4 and a coating-resin layer 5 described below.

A desired number of energy-generating elements 2 is arranged on the substrate 1 (for the sake of convenience, in FIGS. 2A to 2G only two energy-generating elements are shown). The energy-generating elements 2 are connected to control-signal-receiving electrodes (not shown) for operating these elements. In general, for the purpose of improving the service life of the energy-generating elements 2, various functional layers, such as an ink-resistant protective layer composed of a noble metal, are disposed thereon.

A structure in which ink supply ports 3 serving as openings used for supplying ink are formed in the substrate 1 in advance has been described above. The supply ports 3 may be formed by any of methods by which openings may be formed in the substrate 1. For example, a mechanical method, such as drilling, may be employed. Light energy, such as laser, may also be used. The supply ports 3 may be formed by forming a resist pattern on the substrate 1 and chemically etching the pattern. Alternatively, the ink supply ports 3 may be formed not in the substrate 1 but in a resin pattern and may be located on the ink discharge port side of the substrate 1. There is no need for the formation of the ink supply ports 3 in the substrate 1 in advance. The ink supply ports 3 may be formed during a back-end process.

Figure 2E:
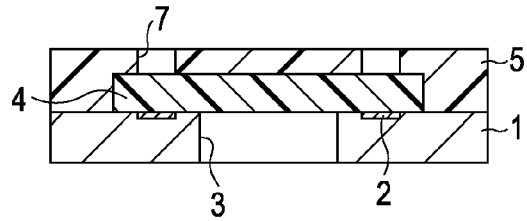
Figure 2B:
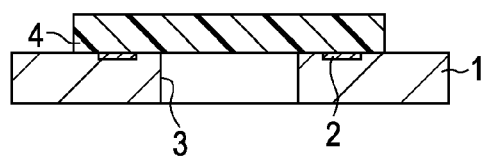

As shown in FIG. 2B, the ink-passage pattern 4 composed of a positive resist (positive photosensitive resin) that is insensitive to light having a wavelength of 300 nm is formed on the substrate 1 having the energy-generating elements 2.

Examples of the positive resist (positive photosensitive resin) that can be used include positive photoresists composed of a mixture of an alkali-soluble resin and either a quinone diazide or naphthoquinone diazide derivative, and photodegradable resists sensitive to ionizing radiation such as electron beams, deep-UV, and X-rays. Examples of the alkali-soluble resin include novolac resins and polyhydroxystyrene.

Examples of the photodegradable resist include vinyl ketone polymer compounds, such as polymethyl isopropenyl ketone and polyvinyl ketone; methacryl polymer compounds, such as polymethacrylic acid, polymethyl methacrylate, polyethyl methacrylate, poly-n-butyl methacrylate, polyphenyl methacrylate, polymethacrylamide, and polymethacrylonitrile; and olefin sulfone polymer compounds, such as poly(butene-1-sulfone) and poly(methylpentene-1-sulfone). Copolymers containing a plurality of the monomer units may be used.

In the present invention, insensitivity to light having a wavelength of 300 nm or more is needed for the positive resist. Sensitivity to light having a wavelength of less than 300 nm is allowed for the positive resist.

In this specification, whether the resist is sensitive or insensitive to light having a wavelength of 300 nm or more is determined by the availability of patterning using light having a wavelength of 300 to 470 nm. Specifically, the determination is made by the following method: A layer composed of a positive resist whose insensitivity to light having a wavelength of 300 nm or more is to be determined is formed on a substrate so as to have a thickness of 20 μm. A linear region having a width of 100 μm is irradiated with light having an integrated light quantity of 500 mJ, developed, and rinsed. The region is irradiated with light beams having wavelengths of 300 nm to 470 nm in 20 nm increments. If a reduction in the thickness of the positive-resist layer is not observed in the region irradiated with the light beams, the resist is determined to be "insensitive to light having a wavelength of 300 nm or more". If a complete or incomplete pattern is formed on the positive resist layer irradiated with the light beams or if a reduction in the thickness of the layer is observed, the resist is determined to be "sensitive to light having a wavelength of 300 nm or more".

Polymers having methyl methacrylate (MMA) units, such as polymethyl methacrylate and MMA/n-butyl methacrylate copolymers, which are insensitive to light having a wavelength of 300 nm or more, may be used without processing.

In the case of a material sensitive to light having a wavelength of 300 nm or more, e.g., polymethyl isopropenyl ketone, the incorporation into the material of an ultraviolet-ray absorber that absorbs light having a wavelength of 300 nm or more allows the material to be insensitive to light having a wavelength of 300 nm or more. The resulting material may be used.

Examples of the UV absorber include 2,4-dihydroxybenzophenone, 2-hydroxy-4-methoxybenzophenone, 2-4-hydroxy-4-n-octoxybenzophenone, 2-hydroxy-4-n-dodecyloxybenzophenone, 2-hydroxy-4-benzyloxybenzophenone, 2,2'-hydroxy-4-methoxybenzophenone, phenyl salicylate, 4-tert-butylphenyl salicylate, 2-hydroxy-4-methoxybenzophenone, and 2,4-di-tert-butylphenyl-3',5'-di-tert-butyl-4-hydroxy benzoate.

The UV absorber may be incorporated in an amount such that the material is insensitive to light having a wavelength of 300 nm or more. For example, about 0.1 to 5.0 percent by weight of the UV absorber may be incorporated into the positive resist.

A positive resist layer composed of such a positive resist is formed on the base including the energy-generating elements. The positive resist layer is subjected to patterning to form an ink-passage pattern. The positive resist layer usually has a thickness of 5 to 30 μm. The patterning of the positive resist layer may be performed by, for example, irradiation with deep-UV light from a deep-UV exposure device through a mask having a desired pattern.

The positive resist layer can be formed by lamination of a separately formed dry film of the positive resist when the substrate 1 provided with the ink supply ports 3 is used. The dry film may be formed by dissolving the positive resist in an appropriate solvent to form a solution, applying the resulting solution to a film such as a PET film, and drying the solution. In this case, a material containing a polymer compound, having high coatability, and capable of being laminated on the ink supply ports 3 can be used as the positive resist. Specifically, a positive resist degradable with an electron beam, deep-UV light, or X-ray ionizing radiation can be used. Alternatively, a filling removable during a back-end process may be disposed in the ink supply ports 3 formed in the substrate 1, and then the positive resist layer may be formed by usual solvent coating, such as spin coating or roll coating. In this case, any of the materials described above may be used.

Figure 2F:
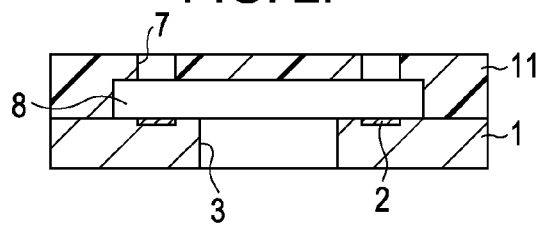
Figure 2C:
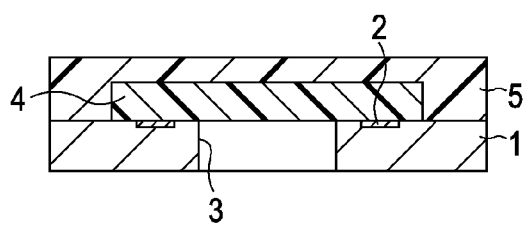

As shown in FIG. 2C, the coating-resin layer 5 composed of a photocationic-curable resin sensitive to light having a wavelength of 300 nm or more is formed on the substrate 1 including the ink-passage pattern 4.

The ink-passage pattern 4 composed of the positive resist is generally soluble in a polar solvent. Thus, a resin that will constitute the coating-resin layer 5 is dissolved in a non-polar solvent, such as toluene or xylene to form a solution. The coating-resin layer 5 can be formed by solvent-coating the solution without adverse effects on the ink-passage pattern 4. The coating-resin layer 5 can be composed of a negative photosensitive resin, such as a photocationic-curable resin.

A photocationic-curable resin containing a sensitizer that sensitizes the resin to light having a wavelength of 365 nm or more may be used as the photocationic-curable resin used here. An example of the photocationic-curable resin is a material containing an epoxy resin, a photocationic initiator, and a sensitizer. Cationic polymerization is a chain transfer reaction. Thus, it is possible to obtain a cured article having crosslink density (glass transition temperature) at a relatively low temperature for a short time after the reaction is initiated.

As the epoxy resin, any known epoxy resin may be used. Examples thereof include EHPE3150 (produced by Daicel Chemical Industries, Ltd.), Epicoat 1110 (produced by Japan Epoxy Resins Co., Ltd.), and Epon SU-8 (produced by Shell Chemicals Limited).

As the photocationic initiator, any known photocationic initiators may be used. Examples thereof include aromatic iodonium salts, aromatic sulfonium salts, and WPI-113 (produced by Wako Pure Chemical Industries, Ltd).

Examples of aromatic sulfonium salts include Irgacure 261 (trade name, produced by Ciba Specialty Chemicals), Adeka Optomer SP-170, Adeka Optomer SP-172, Adeka Optomer SP-150 (produced by Adeka Corporation), and Cyracure UVI6990 (produced by The Dow Chemical Company).

Among these, Adeka Optomer SP-170 and Adeka Optomer SP-172 (trade names, produced by Adeka Corporation) can be used. These photocationic initiators initiate cationic polymerization by irradiation with ultraviolet rays.

These photocationic initiators in combination with a reductant can promote cationic polymerization by heating. Specifically, crosslink density can be increased compared with that in photocationic polymerization in the presence of the photocationic initiator alone. In the case of the combination of the photocationic initiator and the reductant, the reductant can be selected in such a manner that a redox initiator, which does not react at room temperature but reacts at a specific temperature or higher (e.g., 60° C. or higher), is used. A copper compound such as copper triflate is suitable as such a reductant. Furthermore, a reductant such as ascorbic acid is useful.

As the sensitizer, any known sensitizer may be used. The combination of the sensitizer and the photocationic initiator is important. Examples of the photocationic initiator commercially available include Adeka Optomer SP-170, Adeka Optomer SP-172, Adeka Optomer SP-150 (trade names, produced by Adeka Corporation). When an aromatic sulfonium salt is used as the photocationic initiator, an anthracene derivative can be used as the sensitizer. An example of the anthracene derivative is Adeka Optomer SP-100 (trade name, produced by Adeka Corporation).

These photocationic-curable resins may contain an additive and the like, if needed. For example, a flexibility-imparting agent may be incorporated in order to reduce the elastic modulus of a cured article. Furthermore, a silane coupling agent may be incorporated in order to increase adhesion to the substrate.

In general, the coating-resin layer can have a thickness of 10 to 200 μm on the ink-passage pattern.

The coating-resin layer is patterned by irradiation with light having a wavelength of 300 nm to form the discharge ports 7.

The patterning of the coating-resin layer may be performed by, for example, irradiation with the i-line (wavelength: 365 nm) from an i-line exposure device through a mask having a desired pattern. The G-line or the like as well as the i-line may be utilized. Furthermore, a filter that filters out light having a wavelength of 300 nm or less may be used for light emitted from a light source. In this case, the coating-resin layer is exposed to light having a wavelength of 300 nm or more. Thus, the positive resist located below the coating-resin layer is not chemically changed. The coating-resin layer is composed of the photocationic-curable resin sensitive to light having a wavelength of 300 nm or more and thus is effectively cured by irradiation with light having such a wavelength. Among light beams having wavelengths of 300 nm or more, exposure to only a light beam having a wavelength of 350 nm or more, for example, the i-line, can also be performed. For example, some positive resists usable as the lower layer are sensitive to light having a wavelength of about 330 nm. Many positive resists are insensitive to light having a wavelength of 350 nm or more. Thus, exposure of the coating-resin layer to only light having a wavelength of 350 nm or more advantageously results in a wide range of choice for the positive resist.

The phrase "irradiation with the i-line" means that an object is irradiated with only a light beam having a wavelength of 365±10 nm among light beams having wavelengths of 200 to 500 nm.

Figure 2G:
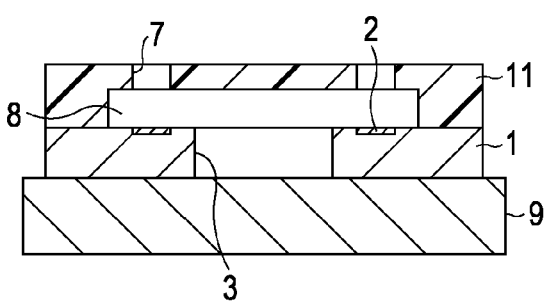
Figure 2D:
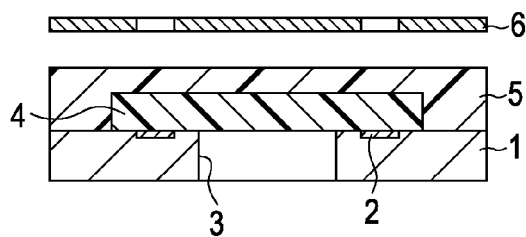

As shown in FIG. 2D, to form ink discharge ports in the coating-resin layer 5, the coating-resin layer 5 is subjected to pattern exposure with a mask 6 having an ink discharge port pattern. Exposure is performed with light having a wavelength of 300 nm or more in such a manner that the ink-passage pattern 4 composed of the positive resist is not changed.

As shown in FIG. 2E, the coating-resin layer 5 is developed with an organic solvent or the like to form the discharge ports 7.

As shown in FIG. 2F, the positive resist constituting the ink-passage pattern 4 is eluted with a solvent to form an ink passage 8. Elution is easily performed by immersing the substrate in a solvent or spraying the substrate with a solvent. Furthermore, a combination of immersion and ultrasound irradiation can be used to reduce the elution time.

As shown in FIG. 2G, if necessary, an ink supply member 9 is formed. An electrical connection for operating the energy-generating elements 2 is established to complete the ink-jet recording head.

The present invention provides a satisfactory effect on a recording head described in U.S. Pat. No. 6,155,673. In an ink-jet recording head described in the patent document, an information signal corresponding to a recording information item is applied to an energy-generating element (electrothermal transducer) to generate thermal energy that results in a rapid increase in the temperature of the electrothermal transducer so as to exceed a temperature required to cause nucleate boiling of ink. The thermal energy produces a bubble in ink. The resulting bubble is allowed to communicate with outside air to discharge an ink droplet, thereby stabilizing the volume and speed of the ink droplet. This results in a high-quality image. In the method described in the patent document, discharge volume is substantially determined by the distance between the electrothermal transducer and the discharge port. Thus, like the present invention, a method in which the distance between the electrothermal transducer and the discharge port can be precisely set with high reproducibility is most suitable. Furthermore, the present invention is effective for a full-line recording head in which recording can be simultaneously performed across the full width of a recording paper sheet and for a color recording head provided integrally with the recording heads or in combination with a plurality of recording heads.

Figure 3:
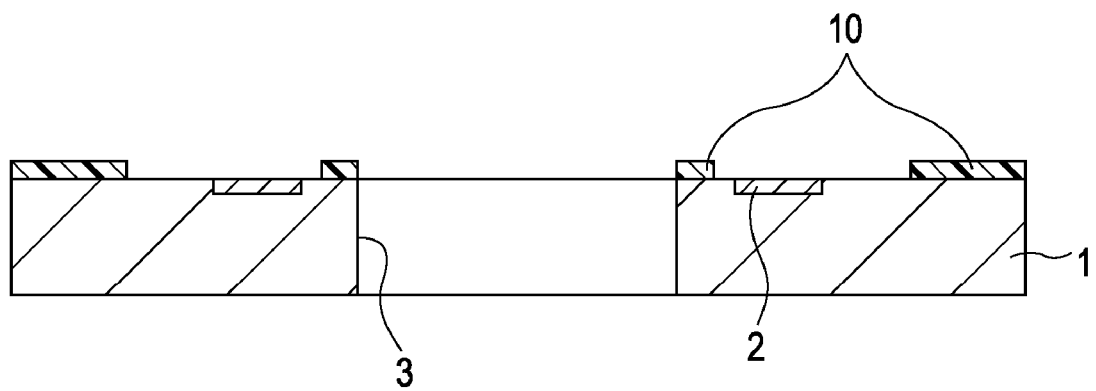
FIG. 3 is a schematic cross-sectional view illustrating a method for producing an ink-jet recording head according to an embodiment of the present invention and is a schematic view of a substrate provided with an adhesion-improving layer.

FIG. 3 is a schematic view of the substrate 1 including an adhesion-improving layer 10 according to an embodiment. In general, to increase adhesion between the substrate 1 and the coating-resin layer 5, an adhesion-improving layer 10 composed of a thermosetting or thermoplastic resin is formed.

To overcome the problems in the case where the adhesion-improving layer pattern is formed, the inventors have conducted intensive studies and have found that the incorporation of an ultraviolet absorber into the adhesion-improving layer reduces light reflected from the adhesion-improving layer. That is, the incorporation of the ultraviolet absorber into the adhesion-improving layer suppresses a reduction in the molecular weight of the ink-passage pattern and crack formation in the coating-resin layer. Thereby, an ink-jet recording head capable of stably discharging ink is obtained.

Any known thermoplastic resin may be used for the adhesion-improving layer. Examples thereof include polyether amide, polyether amide-imide, and polyimide.

An ultraviolet absorber that is not basic can be used as the ultraviolet absorber incorporated because such an ultraviolet absorber does not inhibit cationic polymerization of the coating-resin layer. Examples thereof include 2,4-dihydroxybenzophenone, 2-hydroxy-4-methoxybenzophenone, 2-hydroxy-4-n-octoxybenzophenone, 2-4-hydroxy-4-n-dodecyloxybenzophenone, 2-hydroxy-4-benzyloxybenzophenone, 2,2'-hydroxy-4-methoxybenzophenone, phenyl salicylate, 4-tert-butylphenyl salicylate, 2-hydroxy-4-methoxybenzophenone, 2,4-di-tert-butylphenyl-3',5'-di-tert-butyl-4-hydroxy benzoate. However, compounds other than these examples may be used as long as the compounds are within the scope of the invention.

The adhesion-improving layer can have a content of the ultraviolet absorber of 1 to 10 percent by weight. At an ultraviolet absorber content of less than 1 percent by weight, the effect of the ultraviolet absorber incorporated is not exhibited, in some cases. The upper limit of the ultraviolet absorber content may be set at a value (not to exceed 10 percent by weight) at which the function of the adhesion-improving layer is not impaired.

The present invention may be applied to the following method for producing an ink-jet recording head in addition to the embodiment described above.

FIGS. 4A to 4F are schematic cross-sectional views illustrating a method for producing an ink-jet recording head according to an embodiment of the present invention. FIGS. 4A to 4F show cross sections similar to those shown in FIGS. 2A to 2G.

Figure 4A:
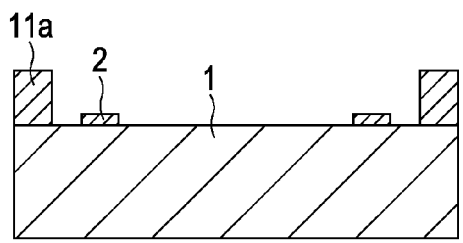
FIGS. 4A to 4F are schematic cross-sectional views illustrating a method for producing an ink-jet recording head according to an embodiment of the present invention.

As shown in FIG. 4A, side walls 11a to be formed into part of the passage-forming member 11 are formed on the substrate 1 including the energy-generating elements 2. As shown in FIG. 4B, the positive resist 12 is formed so as to cover the side walls 11a. The material used for the positive resist is insensitive to light having a wavelength of 300 nm or more, as described above.

The positive resist is polished toward the substrate until the side walls 11a are exposed. In this step, as shown in FIG. 4C, the side walls 11a and the positive resist 12 are planarized. An example of a polishing method is chemical-mechanical polishing (CMP).

Figure 4D:
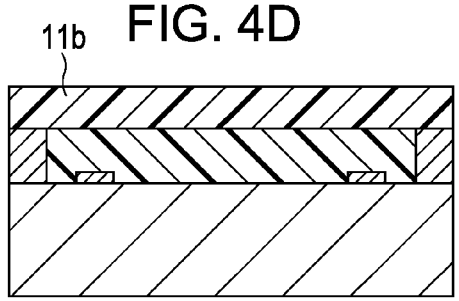
Figure 4B:
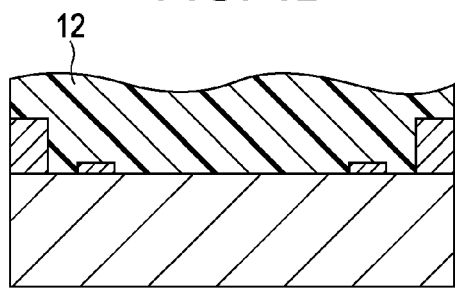

As shown in FIG. 4D, a discharge port-forming resin 11b which serves as part of the passage-forming member and in which discharge ports will be formed is formed on the side walls 11a and the positive resist 12. The discharge port-forming resin 11b is a photocationic-curable resin sensitive to light having a wavelength of 300 nm or more, as described with reference to FIG. 2C.

Figure 4E:
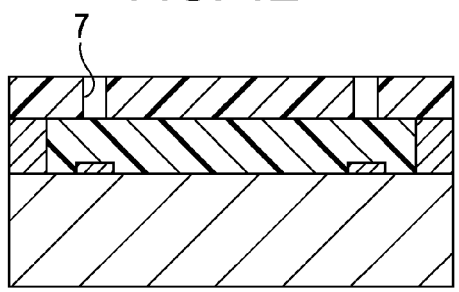
Figure 4C:
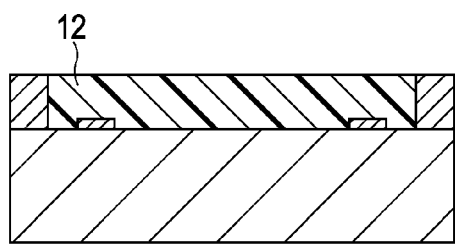
Figure 4F:
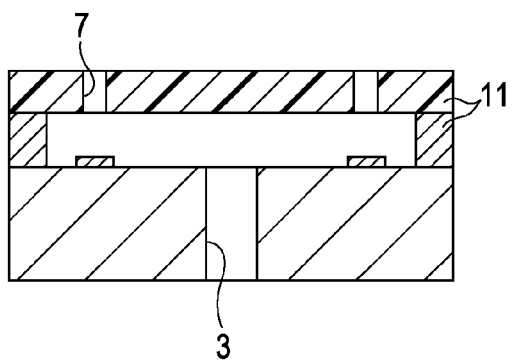

The discharge port-forming resin 11b is exposed to form the discharge ports 7 as shown in FIG. 4E. In this case, exposure is performed with light having a wavelength of 300 nm or more, as described with reference to FIG. 2D.

The ink supply ports 3 are formed in the substrate 1. Then the positive resist 12 is removed to form the structure shown in FIG. 4F.

EXAMPLES

Examples of the present invention will be described below.

Examples 1 to 4

In this example, an ink-jet recording head was produced according to the production procedure (FIGS. 2A to 2G) described above.

A through hole to be the ink supply port 3 was formed by YAG laser on a glass substrate 1 including electrothermal transducers (heaters composed of $HfB_2$) functioning as the energy-generating elements 2 (FIG. 2A).

Polymethyl methacrylate was applied to a PET support and dried to form a dry film. The dry film is transferred by lamination to form a positive resist layer. The resulting positive resist layer was prebaked at 120° C. for 20 minutes and was then subjected to pattern exposure with a mask aligner (trade name: PLA520, with a cold mirror: CM290, manufactured by Canon Inc.) so as to form the ink-passage pattern 4. The exposure was performed for 1.5 minutes. Development was performed with methyl isobutyl ketone/xylene=2/1 (mass ratio). Rinse was performed with xylene. The ink-passage pattern 4 was formed in order to form an ink passage communicating with the ink supply port 3 and the energy-generating elements 2. The ink-passage pattern 4 was left in a region to be formed into the ink passage (FIG. 2B). The ink-passage pattern 4 after development had a thickness of 12 μm.

A composition shown in Table 1 (EXAMPLE 1) or Table 2 (EXAMPLE 2) was dissolved in a xylene/methyl isobutyl ketone mixed solvent to form a composition solution. The composition solution was spin-coated to form a coating-resin layer (FIG. 2C). A filter that filtered out light having a wavelength of 300 nm or less was attached to a mask aligner (MPA600, trade name, manufactured by Canon Inc.). Exposure was performed at an integrated light quantity of 500 mJ (FIG. 2D). A post exposure bake (PEB) was performed at 90° C. for 3 minutes. The coating-resin layer 5 was adjusted so as to have a thickness of 12 μm on the ink-passage pattern 4. The coating-resin layer 5 was subjected to development with CDS630 (trade name, manufactured by Canon Inc.) using an MIBK/xylene (3/2 (mass ratio)) mixed solvent to form the discharge ports 7 (FIG. 2E).

To elute the positive resist constituting the ink-passage pattern 4, the entire surface was subjected to exposure with PLA-520 (trade name, with a cold mirror: CM290) for 2 minutes. The positive resist was immersed in methyl isobutyl ketone while being irradiated with ultrasound using an ultrasonic cleaner to elute the positive resist, thereby forming the ink passage 8 (FIG. 2F).

The ink supply member 9 was bonded to the ink supply port 3, resulting in the completion of an ink-jet recording head.

Ink-jet recording heads in EXAMPLES 3 and 4 were produced as in EXAMPLES 1 and 2, respectively, except that the positive resist constituting the ink-passage pattern 4 contained poly(methyl propenyl ketone) to which 3 percent by weight of a UV absorber (2-hydroxy-4-methoxybenzophenone) was incorporated.

Each of the resulting ink-jet recording heads was mounted on a recording apparatus. Recording was performed with deionized water/glycerol/direct black 154 (water-soluble black dye) (65/30/5 (mass ratio)) ink. The results demonstrated that stable printing was performed with satisfactory droplet landing accuracy.

Comparative Examples 1 and 2

Ink-jet recording heads were produced as in EXAMPLES 1 and 2, except that compositions excluding the sensitizers shown in Tables 1 and 2 were used as the materials for forming the coating-resin layers, and exposure for forming the discharge ports was performed with light beams also including a light beam having a wavelength of 300 nm or more without the filter that filtered out light having a wavelength of 300 nm or less.

Each of the resulting ink-jet recording heads was mounted on a recording apparatus. Recording was performed with the ink used in EXAMPLES 1 to 4. The results demonstrated that printing was performed with poor droplet landing accuracy, in some cases. The nozzles in each of COMPARATIVE EXAMPLES 1 and 2 were cut and analyzed. The analytical results demonstrated that the inner walls of the passage were not smooth and that submicroscopic protrusions were observed in some areas.

TABLE 1

| Ingredient | Trade name | Manufacturer | Content |
|---|---|---|---|
| Coating resin compound | Alicyclic epoxy resin EHPE-3150 | Daicel Chemical Industries, Ltd. | 93 parts |
| Cationic initiator | SP-172 | Adeka Corporation | 2 parts |
| Sensitizer | SP-100 | Adeka Corporation | 1 part |
| Additive | Silane coupling agent A-187 | Nippon Unicar Company Limited | 4 parts |

TABLE 2

| Ingredient | Trade name | Manufacturer | Content |
|---|---|---|---|
| Coating resin compound | Alicyclic epoxy resin EHPE-3150 | Daicel Chemical Industries, Ltd. | 90 parts |
| Cationic initiator | SP-150 | Adeka Corporation | 5 parts |
| Sensitizer | SP-100 | Adeka Corporation | 1 part |
| Additive | Silane coupling agent A-186 | Nippon Unicar Company Limited | 4 parts |

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2006-255813 filed Sep. 21, 2006, which is hereby incorporated by reference herein in its entirety.

What is claimed is:

1. A method for producing an ink-jet recording head including a discharge port configured to discharge ink, a passage-forming member configured to form an ink passage communicating with the discharge port, and a substrate provided with an energy-generating element configured to generate energy utilized for discharging ink, comprising the steps of:

forming a pattern, comprised of a positive photosensitive resin, for the ink passage on the substrate, the pattern containing an ultraviolet absorber that absorbs light having a wavelength of 300 nm or more, and being sensitive to light having a wavelength of less than 300 nm and insensitive to light of a wavelength of 300 nm or more;

forming a coating resin layer, composed of a negative photosensitive resin, on the substrate so as to cover the pattern, the coating resin layer to become the passage-forming member;

exposing the coating resin layer to light having a wavelength of only 300 nm or more to form the discharge port; and removing the pattern to form the ink passage.

2. The method according to claim 1, wherein the positive photosensitive resin contains a polymer having a methyl methacrylate unit.

3. The method according to claim 1,
wherein the coating-resin layer is a photocationic-curable resin containing an aromatic sulfonium salt as a photocationic initiator and an anthracene derivative as a sensitizer to light having a wavelength of 300 nm or more.

4. The method according to claim 1,
wherein the coating-resin layer is exposed to the i-line.

5. The method according to claim 1, further comprising a step of:
forming a thermoplastic resin layer containing an ultraviolet absorber on the substrate before forming the pattern.

6. The method according to claim 5,
wherein the content of the ultraviolet absorber is in the range of 1 to 10 percent by weight with respect to the thermoplastic resin.

7. The method according to claim 5,
wherein the thermoplastic resin is a polyether amide resin.

8. A method for producing an ink-jet recording head including a discharge port configured to discharge ink, a passage-forming member configured to form an ink passage communicating with the discharge port, and a substrate provided with an energy-generating element configured to generate energy utilized for discharging ink, comprising the steps of:
forming side walls for the passage;
forming a positive resist on the substrate, the positive resist containing an ultraviolet absorber that absorbs light having a wavelength of 300 nm or more, and being sensitive to light having a wavelength of less than 300 nm and insensitive to UV light of a wavelength range from 300 nm to 470 nm;
polishing the positive resist toward the substrate so as to planarize the side walls and the positive resist;
forming a coating resin layer on the planarized side walls and the positive resist;
exposing the coating resin layer to light having a wavelength of only 300 nm or more to form the discharge port; and
removing the positive resist to form the passage.

9. The method according to claim 8,
wherein the light to which the coating resin layer is exposed is the i-line.

* * * * *